United States Patent [19]

Flaten

[11] Patent Number: 4,818,726
[45] Date of Patent: Apr. 4, 1989

[54] PROCESS FOR CURING EPOXY ENCAPSULANT ON INTEGRATED CIRCUIT DICE

[75] Inventor: Nordahl T. Flaten, Burnsville, Minn.

[73] Assignee: VTC Incorporated, Bloomington, Minn.

[21] Appl. No.: 175,164

[22] Filed: Mar. 30, 1988

[51] Int. Cl.⁴ ............................................. H01L 23/02
[52] U.S. Cl. ...................................... 437/207; 437/217; 29/827; 29/829; 206/330; 206/332; 357/70; 264/272.13
[58] Field of Search ................... 437/207, 217; 29/827, 29/829; 206/330, 332; 264/272.13

[56] References Cited

U.S. PATENT DOCUMENTS

| | | | |
|---|---|---|---|
| 3,204,329 | 9/1965 | Sweeney | 206/330 |
| 3,444,993 | 5/1969 | Lunsford | 206/330 |
| 3,517,438 | 6/1970 | Johnson et al. | 206/330 |
| 3,655,496 | 4/1972 | Ettre et al. | 206/330 |
| 3,785,895 | 1/1974 | Ettre et al. | 206/330 |
| 3,920,121 | 11/1975 | Miller | 206/330 |
| 4,069,916 | 1/1978 | Fowler et al. | 206/330 |
| 4,243,139 | 1/1981 | Masujima et al. | 206/330 |
| 4,301,921 | 11/1981 | Petuch | 206/330 |
| 4,557,782 | 12/1985 | Swanson | 206/330 |
| 4,568,416 | 2/1986 | Okui et al. | 206/330 |
| 4,621,486 | 11/1986 | Slavicek | 206/330 |
| 4,631,897 | 12/1986 | Slavicek | 206/330 |
| 4,657,137 | 4/1987 | Johnson | 206/330 |
| 4,689,875 | 9/1987 | Solstad | 437/211 |
| 4,702,788 | 10/1987 | Okui | 206/330 |
| 4,708,245 | 11/1985 | Boeckmann et al. | 206/330 |

OTHER PUBLICATIONS

J. N. Lesyk, "Protecting Components on Carrier Tape", Technical Digest, No. 54, Apr. 1979, pp. 17–18.

Primary Examiner—Brian E. Hearn
Assistant Examiner—Beverly A. Pawlikowski
Attorney, Agent, or Firm—Kinney & Lange

[57] ABSTRACT

The present invention provides a method for protecting integrated circuit packages mounted on carrier tapes during manufacturing steps commonly employed in tape automated bonding processes. A reel is provided for winding the carrier tape into a compact package. A steel tape with corrugated longitudinal edges is also provided for winding on the reel in alternating layers with the carrier tape. The carrier tape thus is framed, layer by layer, with the steel tape, thus protecting each integrated circuit package from coming into contact with another object during manufacturing steps, e.g. heat curing.

6 Claims, 4 Drawing Sheets

PROCESS FOR CURING EPOXY ENCAPSULANT ON INTEGRATED CIRCUIT DICE

BACKGROUND OF THE INVENTION

1. Field of the Invention

The present invention relates generally to automated bonding and packaging of integrated circuits and, more particularly, is concerned with an improved method for curing epoxy encapsulant on integrated circuit dice for forming integrated circuit packages. Disclosed is an improved interleaver tape and process for use thereof in protecting epoxy encapsulated integrated circuit dice during heat curing.

2. Description of the Prior Art

An improved method of bonding and packaging integrated circuits is known as tape automated bonding ("TAB"). An example of such a method to which the present invention can be advantageously applied is described in U.S. Pat. No. 4,689,875 assigned to the assignee herein. In the method as taught therein, chips are bonded to a carrier tape to provide a supply of dispensable integrated circuit packages. Carrier tapes are then stored on reels for use in automated operations. As part of the process of producing these packages a tape is adapted in desired patterns for receiving dice. Such patterns include small, flat fingers or leads in a copper layer of the tape which fan out to wider leads. Portions of the tape surrounding the leads will be removed during later processing.

An integrated circuit is positioned above a desired pattern so that the contacts are aligned with the small fingers or leads. The pads are then thermally bonded to their respective leads simultaneously. The bonding operation can involve a large number of leads and pads.

After bonding is completed, the integrated circuits remain attached to the tape by the bond between the contact points and the fingers as well as elements of a support structure left in the carrier tape. At a desired time, the leads and support structure are cut and the circuit is removed from the tape.

Integrated circuits bonded to a carrier tape by the TAB process allow integrated circuit components to be provided on a reel that may be used in automated assembly operations. Integrated circuits may also be transported on such reels to desired locations for testing, assembly and the like, protected against mechanical abrasion and damage. Utilization of a TAB system increases production and provides an economical and reliable means for assembling and bonding integrated circuits, and a protected mode for transporting the final product.

Prevention of mechanical damage to an integrated circuit begins with packaging and protecting an integrated circuit on a carrier tape. The carrier tape will comprise at least two layers, including one of an electrically conductive material, which includes small flat leads. The support structure comprises a carrier bridge or frame of the non-conductive material. Leads of the integrated circuit are cut at a predetermined length from the integrated circuit and outside of the frame.

The electrical contact points between the dice and their respective leads is then coated with an epoxy material to provide insulation and encapsulation. Epoxy encapsulation is the primary way of protecting integrated circuit dice from mechanical damage.

However, epoxy encapsulation materials require heat curing. While it would be convenient to wind immediately the carrier tape with the freshly encapsulated integrated circuits on a reel, such has proven difficult without first curing the epoxy. Should the epoxy come into contact with other materials or structures before curing, the epoxy may adhere to that other material upon curing. Because full curing requires baking the integrated circuit packages for several hours at an elevated temperature, carrier tapes have been cut into relatively short lengths to allow introduction of tape segments to curing ovens for heating. Thereafter, the tape is reconstructed and wound on a supply reel for transportation.

Interleaver tape has been used in the industry to protect carrier tape from mechanical damage during transportation. The carrier tape and interleaver tape are wound on a reel in alternating layers. The edges of the interleaver tape are corrugated so that only edge corrugations of the interleaver tape abut against the carrier tape. Thus, the integrated circuit dice are held spaced from the body of the interleaver tape, giving the desired protection against mechanical damage from abrasion or impact.

Prior art interleaver tapes are made from plastic materials capable of supporting corrugation. However, plastic does not provide protection against static electricity present in manufacturing environment. At least one supplier of prior art interleaver tape has supplied plastic interleaver tape with an aluminum coating to prevent development of static charges.

SUMMARY OF THE INVENTION

The present invention discloses a method for protecting packaged integrated circuits disposed on a carrier tape during curing and transportation of the carrier tape. The present invention allows completion of processes related to packaging an integrated circuit while the carrier tape is wound on a supply reel.

An interleaver tape is used to provide a layer between each layer of a carrier tape for integrated circuits wound on the reel. The interleaver tape is made from an electrically conductive, heat resistant metal or metal alloy. In the preferred embodiment, No. 304 stainless steel is used. In addition, the reel is also constructed of a heat resistant, electricity conducting metal. Both longitudinal edges of the steel tape are corrugated so that the steel tape and the carrier tape are in contact only along portions of each tape adjacent the edges thereof. Thus, the entire length of the carrier tape is effectively held spaced between layers of protective stainless steel. The epoxy encapsulant covering the electrical contact points of each die lies suspended between layers of steel. The wound reel may then be introduced to the curing oven. The epoxy encapsulated dice will not become affixed to one another or with other materials during curing. Further, the steel is electrically conductive and protects the entire length of the carrier tape from static electric discharges. After curing, the reel may be shipped or moved to another process step. The steel tape protects the integrated circuits during transportation.

BRIEF DESCRIPTION OF THE DRAWINGS

FIG. 2A is a partial cross sectional view of a packaged integrated circuit.

DETAILED DESCRIPTION OF THE PREFERRED EMBODIMENTS

Figure 1:
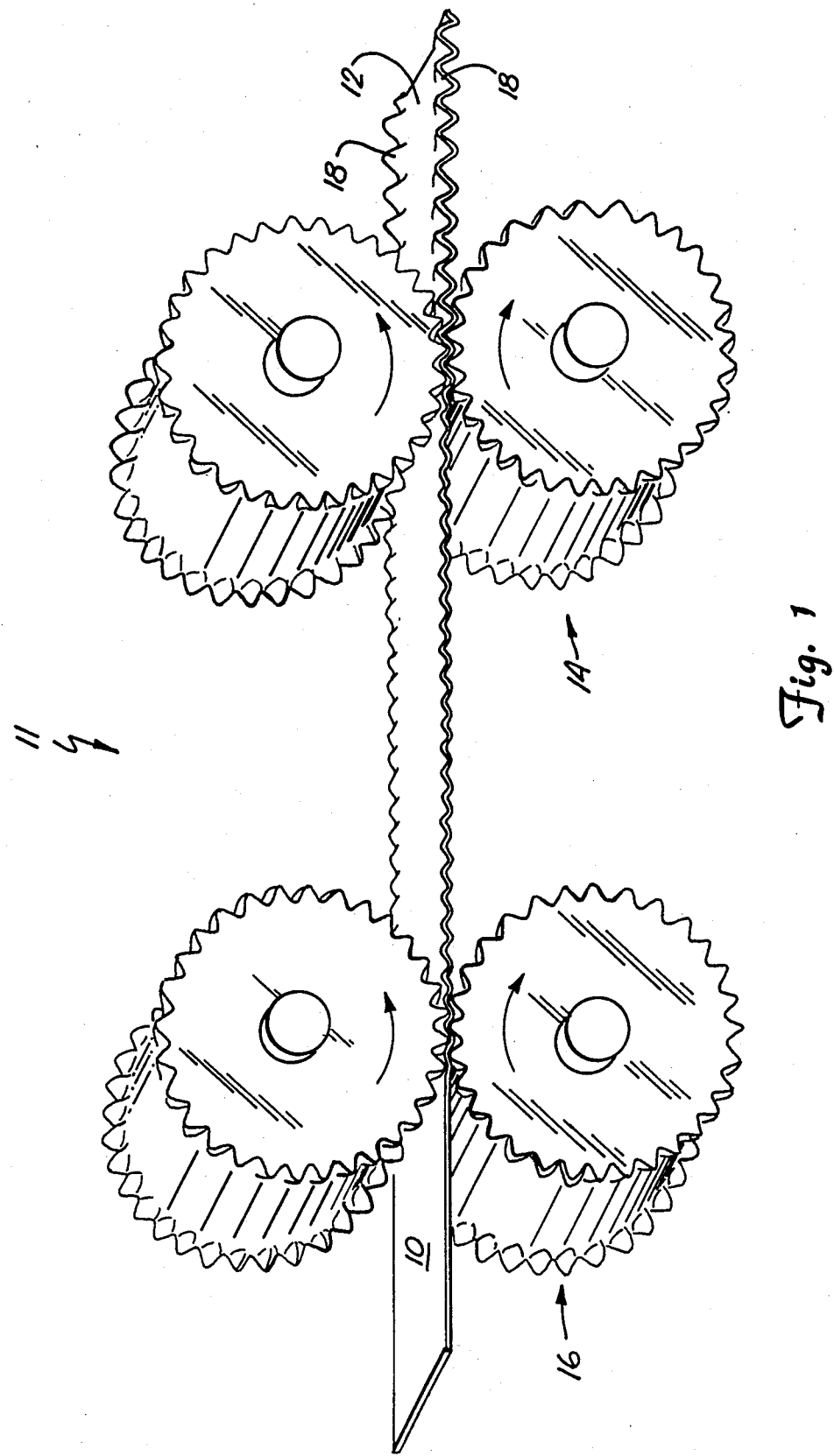
FIG. 1 is a perspective view of a stainless steel tape being corrugated along its longitudinal edges.

FIG. 1 illustrates corrugation of the edges of a steel tape 10. A stainless steel tape, provided in widths of either 24 mm or 35 mm, is introduced to a corrugating apparatus 11. Corrugating apparatus 11 comprises a first set of timing gears 16 and a second set of timing gears 14. Timing gear sets 14 and 16 cooperate to produce a corrugated edge portion 18 along the longitudinal edges of steel tape 10. First timing gear set 16 produces an initial, partial corrugated portion which second timing gear set 14 completes. Corrugated edge portions 18 are preferably substantially sinusoidal and are separated from one another latitudinally by an uncorrugated portion 12 of steel tape 10.

Figure 2:
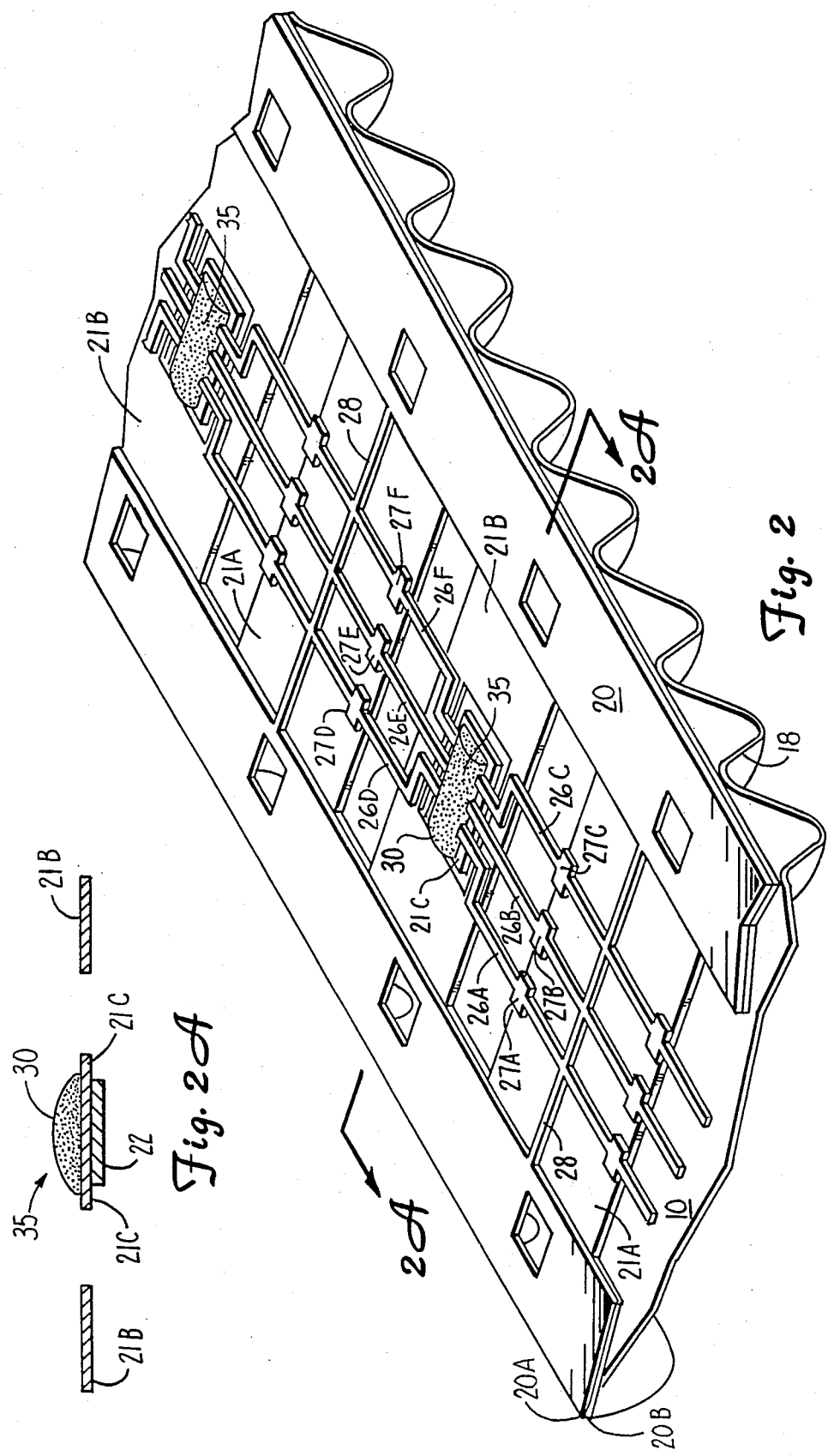
FIG. 2 is a perspective view of a plurality of integrated circuit dice disposed on a carrier tape.

FIG. 2 illustrates a carrier tape 20 bearing epoxy protected semiconductor packages 35. Carrier tape 20 comprises two layers, a polyimide insulating layer 20B and a copper conducting layer 20A. Portions of both insulating layer 20B and conducting layer 20A have been removed. Insulating layer 20B provides structural support for the dice and electrical leads 26A-F provided for connection of the dice to outside electrical components. Electrical leads 26A-F are formed by removing portions of conducting layer 20A.

Insulating layer 20B accordingly includes test pad support members 21A, an electrical lead support member 21B and a die support island 21C.

Electrical leads 26A-F bridge gaps in insulating layer 20B between support island 21C and electrical lead support members 21B and between electrical lead support member 21B and test pad support members 21A. Leads 26A-F electrically connect dice 22 with test pads 27A-F, respectively. Short circuiting networks 28 interconnect groups of test pads 27D-F and 27A-C on each test pad support member to one another and to portions of conducting layer 20A disposed along the longitudinal edges of tape 20. In winding, corrugated edges 18 of steel tape 10 will come into contact with conducting layer 20A allowing all electrical leads 26A-F to be grounded. It will be understood that die 25 can have more or fewer electrical connections than depicted herein, and the figure is exemplary only.

An integrated circuit die 22 (shown in FIG. 2A) is attached to the carrier tape 20 via eutectic bonds between electrical contact points on die 22 and electrical leads 26A-F formed out of conducting layer 20A. Die 22 is held against insulating layer 20B. An epoxy encapsulant 30 is shown applied over a portion of leads 26A-F and the eutectic bonds between leads 26A-F and circuit die 22.

Figure 3:
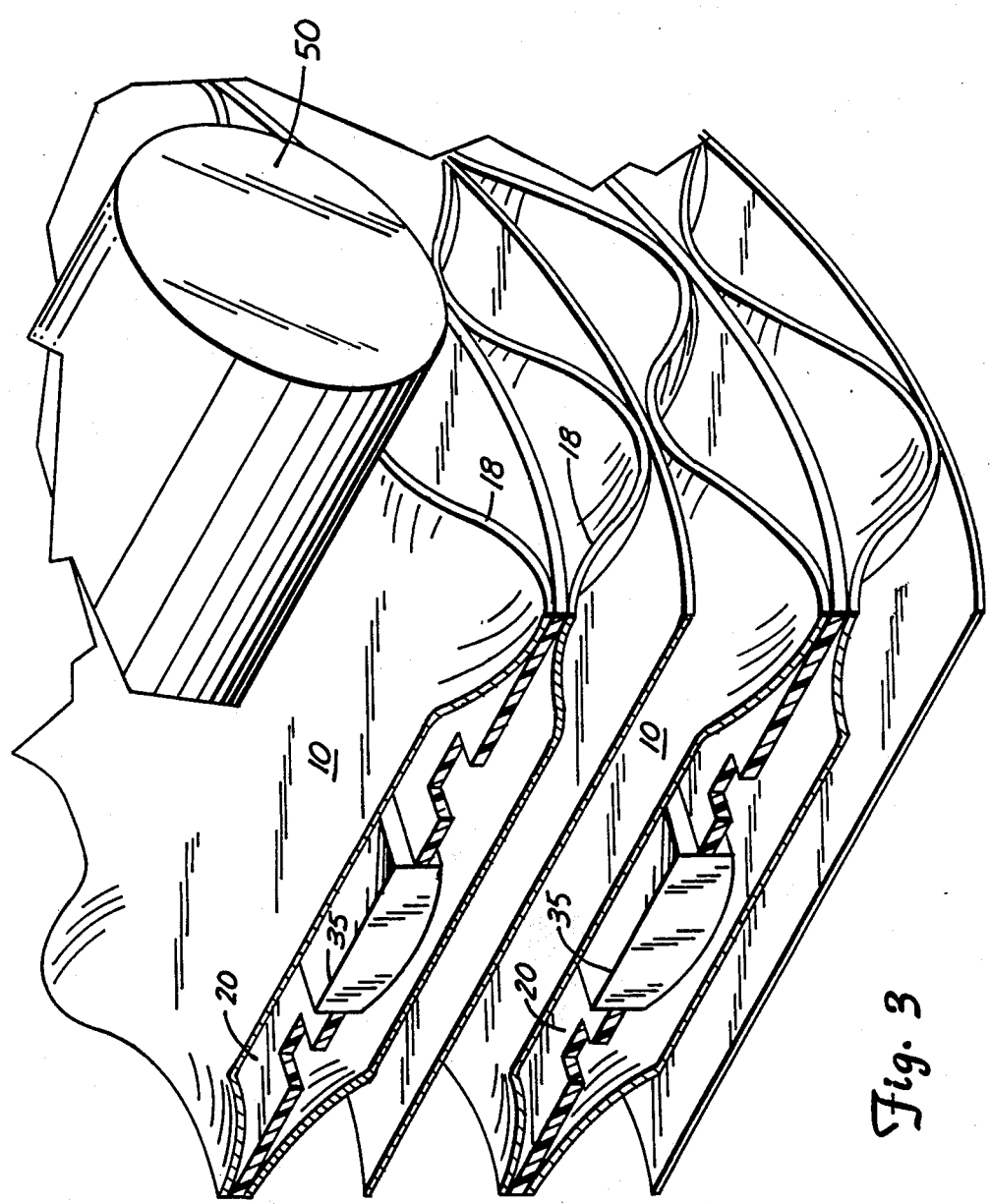
FIG. 3 is a cross sectional view of interleaved carrier tape between layers of steel tape wound on a reel.

FIG. 3 illustrates a cross sectional view of the alternating layers of steel tape 10 wound with carrier tape 20 on a reel 50. Each successive layer of carrier tape 20 is suspended across its edge portion between layers of steel tape 10. Carrier tape 20 contacts steel tape 10 layers only along the corrugated edge portions 18 of steel tape 10. Integrated circuit packages 35 are held in spaced relationship away from contact with layers of steel tape 10.

Figure 4A:
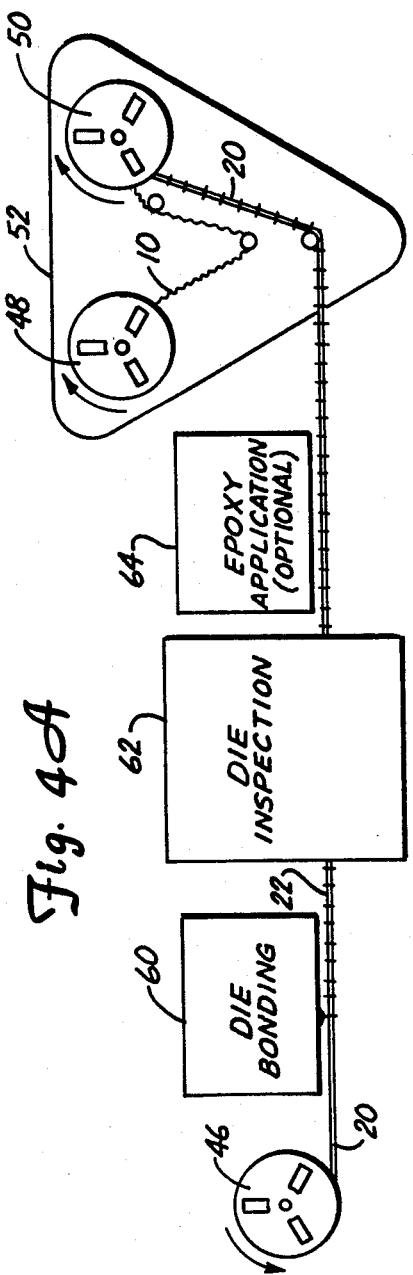
FIGS. 4A and 4B are schematic views of processes using interleaver wound reels.

FIG. 4A illustrates winding a carrier tape 20 onto a reel 50 wherein each successive layer of carrier tape 20 is interleaved with steel tape 10. A supply 46 feeds carrier tape 20 to a die bonding station 60. Carrier tape 20 then carries the dice 22 through a die inspection station 62. In certain applications, epoxy is applied to integrated circuit dice 22 at epoxy application station 64. A supply 48 of steel tape 10 provides steel tape 10 to be paired against and wound on reel 50 interleaved with carrier tape 20. Reel 50 is preferably constructed from steel or another heat resistant and electricity conductive material whereby the fully wound reel may be removed from winding apparatus 52 for introduction to a curing oven or for transfer to an epoxy application station as depicted in FIG. 4B.

Figure 4B:
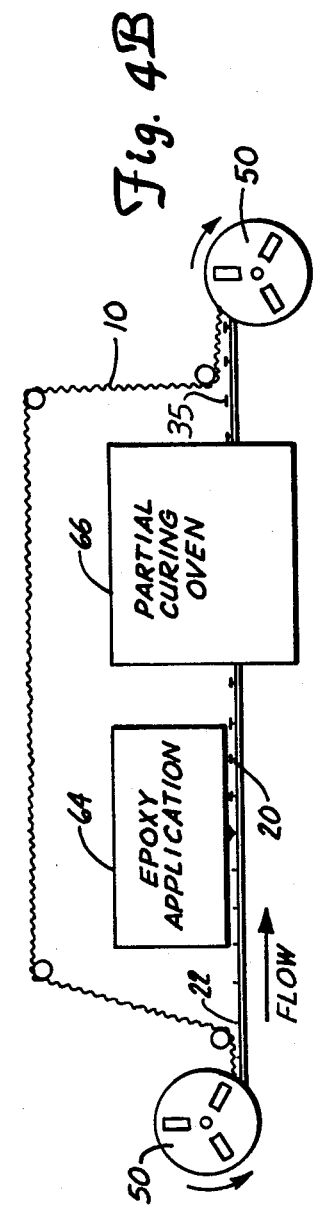

FIG. 4B illustrates use of a supply reel 50 to feed continued processing. Supply reel 50 is unwound and steel tape 10 is separated from carrier tape 20. Steel tape 10 is carried away from processing on carrier tape 20 and bypasses the same. Epoxy may then be applied to integrated circuits 22 on carrier tape 20 at epoxy application station 64. Integrated circuit packages 35 pass through an oven 66 to provide initial curing, but not complete curing, of integrated circuit packages 35. Carrier tape 20 and steel tape 10 may then be rewound, with steel tape 10 providing an interleaver layer between layers of carrier tape 20 on a new supply reel 50. Supply reel 50 is removed and transferred to a curing oven to complete curing of integrated circuit packages 35. Supply reel 50 with carrier tape 20 and interleaver layer of tape 10 may then be shipped to user for use with automated equipment of the end user.

Although the present invention has been described with reference to preferred embodiments, workers skilled in the art will recognize that changes may be made in form and detail without departing from the spirit and scope of the invention.

What is claimed is:

1. A method of protecting integrated circuit packages supported on a carrier tape of a type used in tape automated bonding processes, the method comprising the steps of:
   providing a reel fabricated from a metal or metal alloy;
   providing an interleaver tape fabricated from a metal or metal alloy;
   corrugating longitudinal edge portions of the interleaver tape; and
   winding the carrier tape and the corrugated interleaver tape on a reel in alternating layers, with the integrated circuit packages being suspended between adjacent layers of the carrier tape and the interleaver tape.

2. The method of claim 1 wherein the metal or metal alloy, used to fabricate the interleaver tape and the reel, is electrically conductive.

3. The method of claim 1, wherein the metal alloy is stainless steel.

4. A method protecting semiconductor dice disposed on a carrier tape, the carrier tape having a plurality of openings with individual die support means disposed therein, and each die being at least partially coated with an encapsulated material requiring heat curing, the method comprising the steps of:
   providing a heat resistant interleaver tape;
   corrugating longitudinal edge portions of the interleaver tape;

winding the interleaver tape and the carrier tape onto a reel in alternating layers, with the integrated circuit packages being suspended between adjacent layers of interleaver tape and carrier tape; and introducing the reel into a heated environment kept at a temperature sufficient to cure the encapsulating material.

5. The method of claim 4 wherein the interleaver tape is made of metal.

6. The method of claim 5 wherein the metal is stainless steel.

* * * * *